United States Patent [19]

Gross

[11] 4,317,082

[45] Feb. 23, 1982

[54] CURRENT MIRROR CIRCUIT

[75] Inventor: William H. Gross, Sunnyvale, Calif.

[73] Assignee: National Semiconductor Corporation, Santa Clara, Calif.

[21] Appl. No.: 957,777

[22] Filed: Nov. 6, 1978

[51] Int. Cl.³ ............................................. H03F 3/04
[52] U.S. Cl. .................................... 330/288; 330/311
[58] Field of Search ..................... 330/257, 288, 311; 307/297

[56] References Cited

U.S. PATENT DOCUMENTS 4,103,249  7/1978  Burdick ............................... 330/288

FOREIGN PATENT DOCUMENTS 2546844  5/1976  Fed. Rep. of Germany ...... 330/288

Primary Examiner—James B. Mullins
Attorney, Agent, or Firm—Gail W. Woodward; James A. Sheridan

[57] ABSTRACT

A diode connected transistor acts as a current mirror input stage with the input current source acting as a shunt for the diode. The input stage is coupled to a complementary composite output transistor pair which supplies an output current that mirrors the input current. Since the input shunts the diode, the input potential can approach the supply rail to within substantially less than one $V_{BE}$.

8 Claims, 5 Drawing Figures

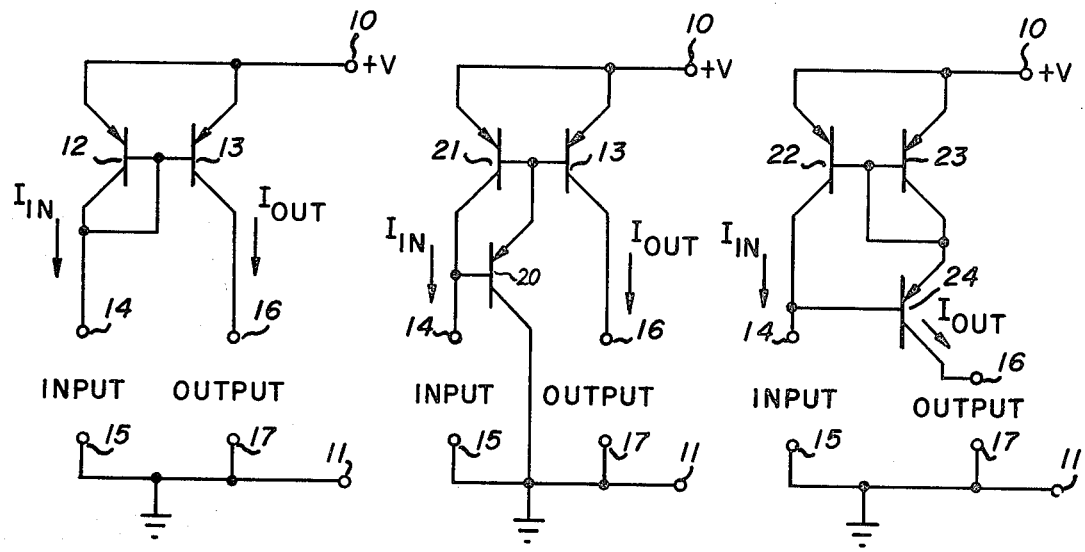
Fig_1 (PRIOR ART)  Fig_2 (PRIOR ART)  Fig_3 (PRIOR ART)
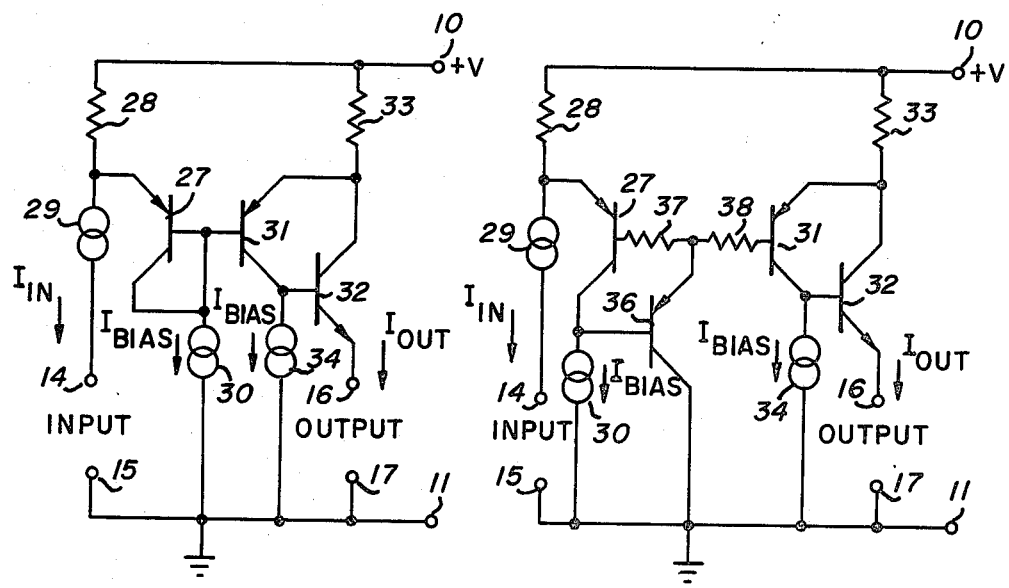
Fig_4  Fig_5

CURRENT MIRROR CIRCUIT

BACKGROUND OF THE INVENTION

The invention relates to current mirror circuits in which an input current is reproduced in an output circuit. Thus, a current sink can be mirrored to act as a current source with both being referenced to a common power supply rail. The prior art circuits typically employ a diode to pass the input current which then must operate at least one $V_{BE}$ from the diode power supply rail. This places a constraint on the dynamic range of the circuit that can be severe at low power supply voltages.

SUMMARY OF THE INVENTION

It is an object of the invention to provide a current mirror having improved dynamic range.

It is a further object of the invention to provide a current mirror circuit that has linear response when the input potential approaches the power supply rail to within less than one $V_{BE}$.

It is a still further object to provide a current mirror circuit of improved dynamic range that has a linear current transfer characteristic that can easily be ratioed.

These and other objects are achieved in a circuit configured as follows. An input stage includes a diode connected transistor and resistor coupled to a power supply rail and biased by a current supply referenced to the other power supply rail. The signal input current shunts the diode. The diode is coupled to an output stage that includes a composite complementary transistor pair connected to mirror the diode current. If the composite pair is coupled to the power supply by a resistor, the current transfer function can be programmed by simply ratioing resistor values. The input potential can approach the supply rail value to within the voltage drop developed across the resistor that couples the diode to the supply rail. This can be made a small fraction of a volt or substantially less than one $V_{BE}$. Circuit performance and linearity can be further improved by using an emitter follower to diode connect the input transistor.

BRIEF DESCRIPTION OF THE DRAWING

FIG. 1 is a schematic diagram of the conventional prior art current mirror;

FIG. 2 is a schematic diagram of the so-called super diode prior art current mirror;

FIG. 3 is a schematic diagram of the so-called Wilson prior art current mirror;

FIG. 4 is a schematic diagram of the basic current mirror of the invention; and

FIG. 5 is a schematic diagram of the preferred current mirror of the invention.

DESCRIPTION OF THE PRIOR ART

FIG. 1 illustrates the conventional prior art current mirror sometimes referred to as a turnaround circuit. Terminals 10 and 11 represent power supply terminals, on rails, with terminal 10 positive for the transistor types shown. Clearly a negative potential would be applied to terminal 10 for complementary transistors. Transistor 12 is diode connected and coupled to transistor 13 as shown. When a current sink device is coupled between input terminals 14 and 15, an input current $I_{IN}$ will flow. Any current flowing in the diode will bias transistor 13 on and a proportional current $I_{OUT}$ will flow into a current sink coupled between output terminals 16 and 17. In this circuit, a current sink can be used to drive a current sink, hence, the name current mirror or turnaround.

If transistors 12 and 13 are the same size (emitter area), $I_{OUT}$ will be substantially equal to $I_{IN}$. This equality will be very close for high Beta transistors. However, for low Beta devices the accuracy of current reproduction declines.

FIG. 2 is often called the super diode current mirror. Here emitter follower transistor 20 acts to diode couple the base of transistor 21 to its collector. In effect, transistor 20 acts to compensate for the base currents in transistors 13 and 21, thus making the circuit substantially independent of transistor Beta. The combination of transistors 20 and 21 creates what is commonly called a super diode.

In FIG. 3, the so-called "Wilson" current mirror is shown. In this case, transistor 23 is diode connected and driven by output transistor 24. Diode 23 drives transistor 22 which in turn drives transistor 24. This circuit too operates with high accuracy with transistor Beta having little effect.

In all of the prior art circuits of FIGS. 1, 2, and 3, the mirror can be ratioed. While not shown, if desired, the emitter areas of the input and output devices can be ratioed to provide a current gain or loss factor. Furthermore, resistors can be coupled in series with either or both of the input and output transistors to effect ratioing of the mirrored current.

It will be noted in the prior art circuits, the circuit of FIG. 1 must have its input terminal at least one $V_{BE}$ below the terminal 10 potential. This means that in terms of dynamic range, terminal 14 can swing between ground and $+V-V_{BE}$. In the circuits of FIGS. 2 and 3 input terminal 14 must be maintained 2 $V_{BE}$ below the positive supply rail. In many circuit designs it is desirable to operate using a signal in which the positive excursions are close to the supply rail potential. In these designs the prior art circuits impose an undesirable limitation.

DESCRIPTION OF THE INVENTION

FIG. 4 shows a simplified version of the invention. The terminal convention is the same as that used in FIGS. 1, 2 and 3. Diode connected transistor 27 has its emitter coupled via resistor 28 to the $+V$ terminal 10. The input terminal 14 is shown as coupled to the emitter of transistor 27 via current source 29. Actually, the emitter of transistor 27 is the input terminal for the mirror. However, current source 29 is present to signify that the input is a current ($I_{IN}$) supply having a high internal impedance. Diode 27 is biased by current source 30. In operation, source 30 is made to supply a current that is much less than the maximum signal input current to be supplied by source 29. The purpose of this current source is to maintain diode 27 conductive regardless of signal input conditions.

Transistors 31 and 32 are complementary and connected together as a composite pair. The composite pair acts as if it were a single PNP transistor having the output impedance and gain of a very high quality NPN transistor. The composite transistor is coupled via resistor 33 to $+V$ terminal 10. Transistor 31 is biased from current source 34, which in a unity gain mirror is made to supply a current equal to that from source 30.

For the condition of zero input current, the current flowing in source 30 will flow in resistor 28. This will establish a bias voltage at the base of transistor 27 and, hence, at the base of transistor 31. If current source 34 matches current source 30, the current flowing in transistors 27 and 31 will be the same. Therefore, if resistor 33 matches resistor 28, substantially zero current will flow in transistor 32 and $I_{OUT}$ will be substantially zero.

For the condition where $I_{IN}$ increases, the emitter of transistor 27 will be pulled toward ground and less current will flow in transistor 27. This means that some of the current from source 30 will flow in the base of transistor 31 which results in the emitter of transistor 31 being pulled toward ground. Some of the increased current flow in transistor 31 will be diverted into the base of transistor 32 which produces an incease in $I_{OUT}$. For the balanced state where resistor 28 equals resistor 33, the $I_{OUT}$ increase will equal the $I_{IN}$ increase.

If desired, the circuit can be made to produce a ratioed output current. The relationship is close to the value $I_{OUT}=I_{IN}(R_{28}/R_{33})$. Thus, the circuit current gain (or loss) can be established by the simple expedient of ratioing the emitter resistors.

The minimum voltage drop across resistor 28 will be equal to its value multiplied by the current in source 30. As a practical matter, this voltage can be made as low as 10 to 20 millivolts. Thus, the input potential at the emitter of transistors 27 can swing to within 10 to 20 mv of the supply potential. This is significantly better than the 700 mv value for the circuit of FIG. 1 and the 1400 mv value for the circuits of FIGS. 2 and 3.

FIG. 5 shows an improvement of the circuit of FIG. 4 and constitutes the preferred embodiment of the invention. Here the collector of transistor 27 drives an emitter follower 36 which has its output coupled back to the base of transistor 27 to create a super diode. In effect, transistor 36 compensates for the base currents of transistors 27 and 31 and acts to make transistor 27 look like an ideal diode. Resistors 37 and 38 are desirably of equal value and operate to equalize the base currents in transistors 27 and 31. The resistors also act to suppress the tendency for lateral PNP transistors to produce parasitic oscillation in high gain circuits.

The operation of the circuit of FIG. 5 is substantially the same as that of FIG. 4. However, the current transfer linearity is considerably better and the circuit performance is relatively unaffected by the differences in transistor Beta that are normally encountered in IC manufacturing.

EXAMPLES

The invention has been embodied in the form shown in FIG. 5 into a commercial IC having the designation LM1870. Transistors 27 and 31 were of conventional lateral construction and identical geometries. Current sources 30 and 34 each supplied 50 microamperes. In one portion of the circuit, resistors 28 and 33 were made to have a value of 470 ohms and resistors 37 and 38 were each 4.7 K ohms. This circuit has a unity gain current transfer. The circuit was operated at a quiescent signal current of 0.5 ma. The current transfer is very linear over the signal range of 0 to 1 ma for supply voltages of about two volts and greater.

In a second portion of the LM1870, resistor 28 has a value of 470 ohms while resistor 33 has a value of 235 ohms. Resistors 37 and 38 have a value of 4.7 K ohms. This circuit has a gain of 2. $I_{OUT}$ is twice the value of $I_{IN}$.

The invention has been described and its relationship to the prior art detailed. Clearly there are alternatives and equivalents that are within the spirit and intent of the invention and that will occur to a person skilled in the art upon reading the foregoing description. For example, all of the devices in the schematic drawings could be replaced by their complements and the applied potentials reversed. Furthermore, provided that suitable level shifting biasing is employed, field effect transistors could be used in place of the bipolar transistors shown. Accordingly, it is intended that the full range of equivalents be accorded to the claims that follow and that the scope of the invention be limited only by the claims.

I claim:

1. A current mirror circuit comprising:
   first and second power supply rails;
   super diode means coupled between said first and second power supply rails, said super diode means comprising a first transistor having emitter, base and collector terminals, and a second transistor connected as an emitter follower having an input coupled to said first transistor collector and an output coupled to said first transistor base whereby said first transistor acts as a super diode;
   means for current biasing said super diode means;
   means for coupling a signal input current in shunt with said super diode means;
   a composite complementary transistor pair having a signal input terminal coupled to said super diode means and a pair of controlled conduction terminals, one of said controlled conduction terminals being coupled to said first power supply rail and the other of said controlled conduction terminals providing a signal output current; and
   means for current biasing said composite pair whereby said signal output current mirrors said signal input current.

2. The current mirror of claim 1 wherein said means for coupling said super diode means and said complementary pair to said first power supply rail comprise resistors.

3. The current mirror of claim 2 wherein said resistors are ratioed to ratio said signal output current with respect to said signal input current.

4. The current mirror of claim 3 wherein said super diode means is coupled to said input terminal of said complementary pair by resistor means.

5. A current mirror circuit comprising:
   first and second terminals connectible to a source of operating potential;
   first, second and third transistors of like conductivity type, each having emitter, base, and collector electrodes;
   first and second impedance means coupled respectively between said emitters of said first and second transistors and said first terminal;
   means for coupling a signal input current to said emitter of said first transistor;
   means for coupling said collector of said first transistor to the base of said first transistor;
   means for coupling said collector of said first transistor to said base of said third transistor;
   means for coupling said emitter of said third transistor to said base of said first transistor;
   means for coupling said base of said third transistor and the collector of said first transistor together and to a first biasing current means for coupling a first biasing current to said second terminal;

means for coupling the collector of said third transistor to said second terminal;

means for coupling said bases of said first and second transistors together;

a fourth transistor complementary to said first second and third transistors and having emitter, base, and collector electrodes;

means coupling said collector of said fourth transistor to said emitter of said second transistor;

means for coupling said base of said fourth transistor to said collector of said second transistor; and means for coupling said emitter of said fourth transistor to supply a signal output current that mirrors said signal input current.

6. The circuit of claim 5 wherein said first and second impedance means are ratioed in value to ratio said signal output current to said signal input current.

7. The circuit of claim 5 further comprising a second biasing current sink coupled between said collector of said second transistor and said second terminal to provide means for returning a second biasing current to said second terminal.

8. The circuit of claim 7 wherein said bases of said first and second transistors are coupled together by a pair of series connected resistors and the juncture of said pair of resistors is connected to said emitter of said third transistor.

* * * * *